United States Patent
Ballagh et al.

(10) Patent No.: US 7,797,677 B1
(45) Date of Patent: Sep. 14, 2010

(54) USING SCRIPTS FOR NETLISTING IN A HIGH-LEVEL MODELING SYSTEM

(75) Inventors: Jonathan B. Ballagh, Boulder, CO (US); Sean A. Kelly, Boulder, CO (US); Roger B. Milne, Boulder, CO (US); Shay Ping Seng, San Jose, CA (US); Jeffrey D. Stroomer, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 960 days.

(21) Appl. No.: 11/268,801

(22) Filed: Nov. 8, 2005

(51) Int. Cl.
  *G06F 9/44* (2006.01)
(52) U.S. Cl. .......................... 717/115; 703/14; 703/15; 703/16; 716/4; 716/5; 716/6; 716/11; 716/12; 716/13; 716/14; 716/15; 716/16
(58) Field of Classification Search .................. 717/115
  See application file for complete search history.

(56) References Cited

U.S. PATENT DOCUMENTS

| | | | |
|---|---|---|---|
| 6,915,306 B1 * | 7/2005 | Gong et al. .................. 707/102 |
| 7,007,261 B1 | 2/2006 | Ballagh et al. | |
| 7,035,781 B1 * | 4/2006 | Flake et al. .................... 703/14 |
| 7,099,753 B2 | 8/2006 | Gvillo | |
| 7,203,632 B2 * | 4/2007 | Milne et al. .................... 703/14 |

OTHER PUBLICATIONS

Robert L. Henderson, Job scheduling under the Portable Batch System, 1995, Springer Berlin / Heidelberg, Job Scheduling Strategies for Parallel Processing, vol. 949/1995, 279-294.*
Sneed, H M., Wrapping legacy COBOL programs behind an XML-interface, 2001, Reverse Engineering, 2001. Proceedings. Eighth Working Conference on, 189-197.*
Simulink, Dynamic System Simulation for MATLAB, Using Simulink, Version 3, Jan. 1999.*
U.S. Appl. No. 11/268,918, filed Nov. 8, 2005, Jeffrey D. Stroomer et al., "Using XTables to Communicate in a High Level Modeling System", 28 pages, available from Xilinx, Inc., 2100 Logic Drive, San Jose, CA 95124.
"Introducing JSON", Nov. 2, 2006, pp. 1-5, available from http://json.org.

(Continued)

*Primary Examiner*—Hyung S Sough
*Assistant Examiner*—Kimberly Jordan
(74) *Attorney, Agent, or Firm*—Kevin T. Cuenot; LeRoy D. Maunu; Lois D. Cartier (57) ABSTRACT

A method of passing data among modules of a heterogeneous software system can include identifying a scripted function to be executed within the heterogeneous software system and building a wrapper script by embedding a call to the scripted function and an XTable object associated with the scripted function within the wrapper script. The method further can include executing the wrapper script thereby causing the scripted function to execute and receiving a result from execution of the scripted function.

20 Claims, 3 Drawing Sheets

OTHER PUBLICATIONS

U.S. Appl. No. 11/250,942, filed Oct. 14, 2005, Haibing, Ma et al., "Method and Apparatus for Translating an Imperative Programming Language Description of a Circuit into a Hardware Description" 40 pages, available from Xilinx, Inc., 2100 Logic Drive, San Jose, CA 95124.

Callahan, John R. et al., "A Packaging System for Heterogeneous Execution Environments," *IEEE Transactions on Software Engineering*, Jun. 1991, pp. 626-635, vol. 17, No. 6.

Sawyer, Nick, *High-Speed Data Serialization and Deserialization (840 MB/s LVDS)* Jun. 19, 2002, pp. 1-13, Application Note XAPP265 (1.3), available from Xilinx, Inc., San Jose, CA, USA.

Sung, Wonyong, "A Hardware Software Cosimulation Backplane with Automatic Interface Generation," *Proc. of the Asia & South Pacific Design Automation Conference*, Feb. 10, 1998, pp. 177-182.

Allexperts, "Associate Array: Encyclopedia," downloaded Apr. 22, 2010 from http://en.allexperts.com/e/a/as/associative_array.htm, pp. 1-10.

Oracle Corp., *Class Hash Map*, Java 2 Platform Std. Ed. v1.4.2, copyright 2003, pp. 1-8, Oracle Corp., Redwood Shores, California.

Woolf, Bobby, "The Object Recursion Pattern," *Proc. of the 5th Pattern Language of Programming Conference*, Aug. 12, 1998, pp. 1-8, Allerton Park, Illinois, USA.

\* cited by examiner

USING SCRIPTS FOR NETLISTING IN A HIGH-LEVEL MODELING SYSTEM

BACKGROUND

1. Field of the Invention

The present invention relates to the field of integrated circuits and, more particularly, to simulation and/or modeling systems used in the design of integrated circuits.

2. Description of the Related Art

Integrated circuits (ICs), such as field programmable gate arrays (FPGAs), can be designed using High Level Modeling Systems (HLMSs). An HLMS is a software-based design tool which provides blocks that can be combined to build a circuit design. A block refers to a high level software construct which represents a particular circuit function, such as multiplexing, addition, multiplication, or the like. The blocks can be arranged within the HLMS to form a circuit. Communication among the blocks can be represented by wires, or signals, which graphically link the blocks. Once configured, the HLMS can run various simulations upon the design. The HLMS further can generate a hardware implementation from the block representation of the circuit design. For example, an HLMS can generate the bitstream necessary to program an FPGA or can generate hardware description language (HDL) files necessary to specify the hardware design.

One example of an HLMS is System Generator™, available from Xilinx, Inc. of San Jose, Calif. System Generator™ is a system level modeling tool that facilitates FPGA hardware design. System Generator™ can function with other design tools to provide a modeling environment that is well suited to hardware design. The System Generator™ tool provides high level abstractions, i.e., blocks, which can be automatically compiled into an FPGA. In addition, access to underlying FPGA resources can be provided through low level block abstractions, which facilitate the construction of highly efficient FPGA designs.

In general, an HLMS is comprised of a plurality of different software modules. Examples of the different software modules used to form an HLMS can include, but are not limited to, connectivity handlers, various types of netlisters, simulation engines, and the like. While some of the software modules forming the HLMS may be coded in a particular, or same, programming language, it often is the case that these modules are coded using different programming languages.

One reason that software modules are coded in different programming languages is that it is desirable to incorporate modules from a variety of different manufacturers within an HLMS. It is difficult to anticipate every need of a circuit designer within a given tool. Allowing the inclusion of modules from third-party manufacturers broadens the functionality and usefulness of a tool. Each manufacturer, however, is unlikely to use a same programming language when implementing these software modules. Notwithstanding, these disparate modules must coexist and interact with one another.

Another reason for the heterogeneity among software modules of an HLMS is that software modules often are coded using a programming language that is suited to the type of data that will be processed by each module. For example, netlisting, as performed by a netlister module, refers to the process of translating a design from a high level abstraction into hardware. Netlisting usually is performed in two phases. The first involves compiling a circuit design into an intermediate format comprised of several different files. These files need not be homogeneous. For example, these intermediate files can include VHDL files, Verilog files, Xilinx NGC netlist files, cores, circuit constraints, and the like. VHDL and Verilog files are human-readable text, while Xilinx NGC files are binary. Cores can be implemented as human-readable Electronic Data Interchange Format (EDIF) files or as encrypted binary files. Circuit constraints can be specified as a Tool Command Language (Tcl) script in some cases or as Xilinx Constraint Files (XCFs) or Netlist Constraint Files (NCFs) in others.

The second phase of netlisting involves the application of standard tools, available from within a development environment such as System Generator™, to the intermediate files to generate working hardware, i.e., a bitstream for programming an FPGA. As noted, the intermediate files can be very dissimilar. Accordingly, the various tools applied to the intermediate files can be implemented in a variety of different programming languages depending upon the particular data and/or file type being processed.

Despite this heterogeneity within an HLMS, the constituent software modules must be able to exchange data between one another. Data exchange must be performed in an efficient manner as a large amount of data is exchanged within the HLMS during operation. The types of data that must be exchanged can include, but are not limited to, netlisting data, simulation data, and global session data.

Netlisting data can specify the attributes of the blocks used to construct the circuit design, data types associated with ports of the blocks, clocking and data rate information, as well as connectivity between the blocks. Simulation data specifies attributes of the blocks that affect how the block functions during simulation. This data can specify initial configurations, for example, for the blocks. Global session information specifies data that is saved when the circuit design is netlisted. This information can specify attributes such as the model name of a circuit design, various code generation options, and other data items which may be used by downstream processes.

In terms of communication within an HLMS, this data must be passed between these various modules using data types and/or structures that are supported by each programming language. Accordingly, it would be beneficial to provide a mechanism and a technique for exchanging data among software modules of an HLMS, or other heterogeneous software-based system, which overcomes the difficulties described above.

SUMMARY OF THE INVENTION

The present invention provides methods of communicating and exchanging data within a heterogeneous software system. One embodiment of the present invention can include a method of passing data among modules of a heterogeneous software system. The method can include identifying a scripted function to be executed within the heterogeneous software system and building a wrapper script by embedding, within the wrapper script, a call to the scripted function and an XTable object associated with the scripted function. The method also can include executing the wrapper script thereby causing the scripted function to execute and use the XTable object as input and receiving a result from execution of the scripted function.

In one embodiment, the receiving step can include generating an XTable object comprising the result from execution of the scripted function. In another embodiment, the receiving step can include modifying the XTable object to include the result from execution of the scripted function.

In one embodiment, the method can include classifying a call to the scripted function as cheap and selectively embedding a call to at least one additional scripted function and an XTable object associated with the at least one additional scripted function within the wrapper script. Accordingly, execution of the wrapper script can cause each call to a scripted function embedded within the wrapper script to execute. In another embodiment, the method can include classifying a call to the scripted function as expensive. In that case, the method can include embedding no other calls to scripted functions within the wrapper script.

The method also can include visually indicating a status of execution of the scripted function. A control also can be presented. Selection of the control can cause execution of the scripted function to terminate.

Another embodiment of the present invention can include a method of passing data among modules of a heterogeneous software system. The method can include identifying a plurality of scripted functions to be executed in batch within the heterogeneous software system and building a wrapper script by embedding a call to each of the plurality of scripted functions and an input object associated with each of the plurality of scripted functions within the wrapper script. The method also can include executing the wrapper script, wherein the plurality of scripted functions store intermediate results within state variables defined within the wrapper script, and generating a final result according to the intermediate results stored in the state variables.

The generating step can include executing a wrap-up script which produces a result which depends upon the intermediate results from the state variables. The input objects embedded within the wrapper script can be configured as XTables.

The method also can include indicating a measure of progress for execution of at least one of the plurality of scripted functions. A measure of progress for execution of the plurality of scripted functions as a whole also can be indicated. The particular scripted function of the plurality of scripted functions that is executing at a given time also can be indicated. A control, the selection of which causes execution of at least one scripted function to discontinue, further can be presented.

Another embodiment of the present invention can include a method of passing data among a plurality of software modules of a heterogeneous software system. The method can include distinguishing between expensive scripted functions and cheap scripted functions. A wrapper script can be built by embedding a single call to an expensive scripted function and an input object associated with the expensive scripted function within the wrapper script, or by embedding a call to each of a plurality of cheap scripted functions and an input object associated with each of the plurality of cheap scripted functions within the wrapper script. The wrapper script can be executed thereby causing each scripted function specified therein to execute.

A result object can be obtained from execution of each scripted function. In one embodiment, the result objects can be XTables. Further, each input object embedded within the wrapper script can be an XTable. An indication of execution progress can be presented for at least one scripted function called by the wrapper script.

The method further can include detecting a fault condition during executing of a scripted function called by the wrapper script. Fault data from the fault condition can be formatted as an XTable to be provided to a software module of the heterogeneous software system.

BRIEF DESCRIPTION OF THE DRAWINGS

There are shown in the drawings, embodiments which are presently preferred, it being understood, however, that the invention is not limited to the precise arrangements and instrumentalities shown.

DETAILED DESCRIPTION OF THE INVENTION

The present invention provides a solution for exchanging data within a heterogeneous software system (HSS). As used herein, an HSS can be one that is comprised of software modules written in different languages. One example of an HSS is a High Level Modeling System (HLMS) for use in designing and/or simulating integrated circuits. In accordance with the inventive arrangements disclosed herein, recursive objects including data structures, referred to as XTables, can be used to convey information to various software modules executing as part of, or within, an HSS. The XTables provide a mechanism for exchanging data which can be understood by different software modules, regardless of the particular programming language used to code such modules. The use of XTables facilitates the exchange of information within the HSS as well as automation of various functions through the use of a scripting language. A recursive object can be a data structure that is composed of one or more elements at least some of which are also data structures. An example of a recursive object is an XTable.

An XTable refers to a data structure that is comprised of one or more data items. Each data item has a corresponding data type. The data types that can be included within an XTable can be limited to only those data types which have a natural internal representation in most modern programming languages. The following rules define, generally, how an XTable is formed. An empty value can be an XTable. Booleans, strings, integers, and real numbers can be XTables in and of themselves or can be included as data items within an XTable. A finite sequence, whether empty or nonempty, can be an XTable if each element of the sequence is itself an XTable. A key/value map, whether empty or nonempty, can be an XTable if the keys are strings and each value is an XTable. Thus, as can be seen, the XTables can be recursive in nature as an element of an XTable itself can be considered an XTable.

Some Examples of Xtables are: 1. 123 (this is an XTable because integers are XTables.); 2. true (this is an XTable because Booleans are XTables). 2. "abc" (this is an XTable because strings are XTables); 3. [1, 2, 3] (this is an XTable because it is a sequence of three objects, each of which is an XTable); 4. [[1], [2, 3]] (this is an XTable because it is a sequence of two objects, each of which is an XTable); and 5. { } (this is an XTable because it is an empty key/value map); 6. {"abc"=>123} (this is an XTable because it is a key/value map in which every key is a string, and every value is an XTable); and 7. 1.33 (this is an XTable because real numbers are XTables).

As noted, the data types that can be used as, or within, an XTable can be limited to those which have natural internal representations in modern programming languages. Examples of such modern programming languages can include, but are not limited to, interpreted or scripted languages such as Practical Extraction and Report Language (PERL), Python, Java®, Tool Command Language (Tcl), and M-code from Matlab®, as well as other programming languages which must be compiled such as C, C++, and the like.

The particular manner in which an XTable is represented can vary with the programming language that is being used to manipulate the XTable. For example, in PERL, Python, and Java®, the empty value can be represented as "undef", "None", or "null" respectively. A sequence XTable can, but need not, be represented as a PERL array, a Python list, or a Java® ArrayList respectively. Similarly, a key/value map can be represented as a PERL hash table, a Python dictionary, or a Java® TreeMap. Other representations are possible; for example, in Java®, a HashMap can be used instead of a TreeMap to represent a key/value map.

Table 1 below illustrates one example of an XTable.

TABLE 1

PERL XTable Example

{
    "key1" => "value1",
    "key2" => 1,
    " " => [1, 2, "three"]
}

The XTable illustrated in Table 1 is expressed using ordinary PERL syntax. The Xtable comprises a key/value map consisting of three key/value pairs. The keys are the strings "key1", "key2", and " " (the empty string). The corresponding values are, respectively, the string "value1", the integer 1, and a sequence. All three values of the key/value map are themselves XTables. The sequence consists of the integers 1 and 2, and the string "three". Thus, the Xtable is expressed using syntactically correct PERL script. In this example, the braces "{" and "}" delimit a key/value map, while the symbol "=>" separates keys from values within the map. The symbols "[" and "]" delimit the sequence having values of "1, 2, 'three'".

Table 2 below expresses the same XTable using Python.

TABLE 2

Python XTable Example

{
    "key1": "value1",
    "key2": 1,
    " ": [1 , 2, "three"]
}

An XTable can be rendered or represented in binary format or as human-readable text. The examples shown in Tables 1 and 2 illustrate embodiments where the XTable has been converted into a human-readable format. When presented in human-readable format, the XTable can be represented using any of a variety of different programming languages such as C or C++, as well as interpreted languages such as Java® or the like.

Accordingly, when the XTable of Table 1 is executed using an appropriate PERL interpreter, i.e. included in the HSS, the result is a PERL representation of the XTable data structure. The HSS can include interpreters for a variety of languages. As such, if the XTable were expressed as Java®, Tcl, or M-code, a suitable interpreter could be used to process the XTable as required.

It should be appreciated that expressing an XTable in native syntax for one programming language does not preclude the XTable from being interpreted and manipulated in a second programming language. Such action requires only suitable parsing and compilation tools to be available for the second programming language. For example, in a heterogeneous system such as System Generator™, which is an HLMS available from Xilinx, Inc. of San Jose, Calif., Java® code has been augmented to interpret and manipulate XTables expressed in PERL syntax.

Figure 1:
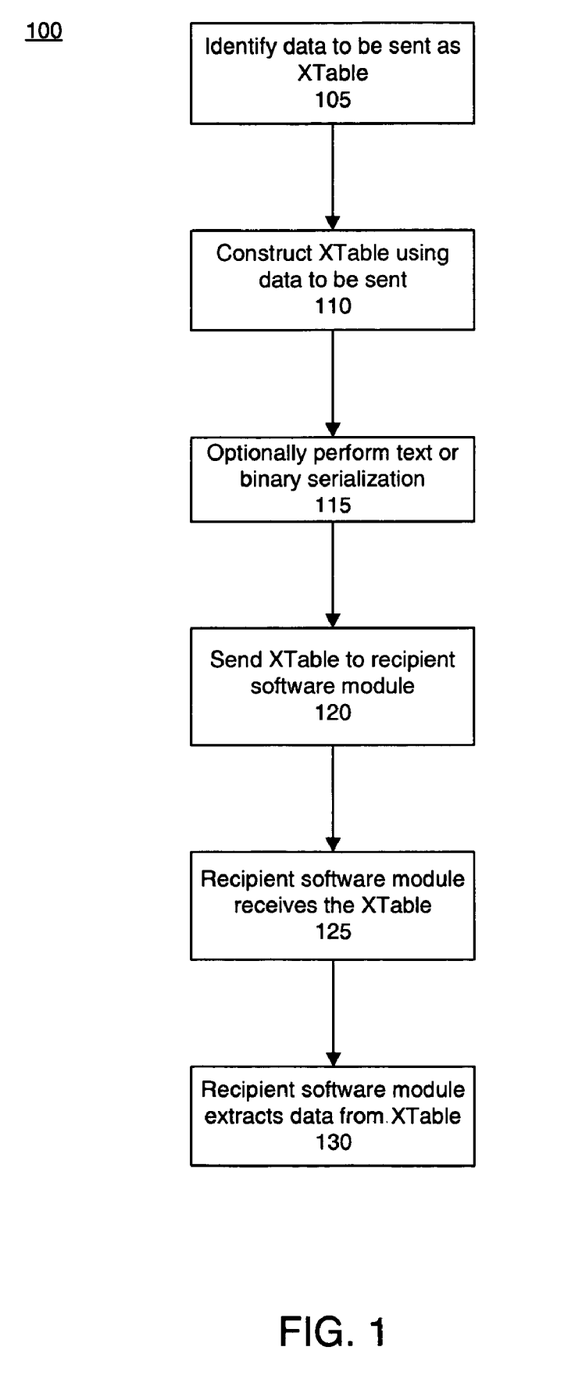
FIG. 1 is a flow chart illustrating a method of exchanging data among a plurality of software modules of a heterogeneous software system (HSS) in accordance with one embodiment of the present invention.

FIG. 1 is a flow chart illustrating a method 100 of exchanging data among a plurality of software modules of an HSS. For purposes of illustration, the method 100 will be described with reference to an HLMS such as System Generator™. It should be appreciated, however, that the present invention is not so limited and that the embodiments disclosed herein can be applied to any of a variety of different HSSs. Accordingly, the method 100 can begin in step 105 where data that is to be sent from one software module of the HLMS to another can be identified. To effectively communicate this data, the data can be formatted and sent as an XTable.

In step 110, the XTable can be constructed using the identified data. As noted, an XTable can be formed of one or more data elements. Each data element can have a corresponding data type which is widely supported among different programming languages. In one embodiment, the data types that can be included, or used, as part of an XTable can be limited to only those data types which are common to each programming language used to code a software module or script within the HLMS. Thus, if the HLMS includes software modules coded in Java®, PERL, C++, and M-code, the available data types can be those which have corresponding internal representations in each of these different programming languages. Thus, the available data types can include, but are not limited to, Booleans, strings, integers, real numbers, sequences, and key/value maps.

In step 115, binary or text serialization of the XTable optionally can be performed. Serialization, whether binary or text, can be performed in cases where the sending and receiving modules are coded in a same programming language or in different programming languages. Binary serialization of an XTable utilizes recursive processing and analysis. During this process, XTable elements, or data items, are written in a fixed format to a binary data stream. The endianness and bit width of elementary data types are fixed. A unique format word, serving as a data type identifier, further can be written to the stream prior to each data type. For composite data types, such as sequences and key-value maps, the format word is followed by an additional length word. The length word indicates the number of top-level elements in the composite. It should be appreciated, however, that top level elements themselves within the composites can be composite objects.

Text serialization is similar to that of binary serialization. One exception is that text serialization utilizes special delimiter tokens to format composite objects of the XTable. In one embodiment, non-composite data types can be streamed using a standard input/output (I/O) provided by the target software module. Special characters can be used to delimit string values. Either type of serialization may be used.

Text serialization can be beneficial in cases where debugging is desired. Binary serialization can be beneficial in cases where speed and compactness of representation are desired. In any case, because XTables support a small set of data types, and do not support pointers, serialization can be performed in a fast and efficient manner. The serialized XTable has a small bit volume.

In step 120, the XTable, whether serialized or not, can be sent, or otherwise made available, to the recipient software module. For example, in one embodiment, the XTable can be stored as a file within the HLMS by either the sending or recipient module. The XTable can be stored in its serialized form, whether binary or text, or in its deserialized form, i.e., as human-readable text. The XTable can be provided to a recipient software module by passing, to the recipient software module, a handle, pointer, path, or the like which references the XTable.

As noted, the XTable can include one or more heterogeneous data elements with respect to data type. In accordance with the inventive arrangements disclosed herein, the XTable can be passed from the sending software module to the receiving software module as a single parameter or object, despite the possibility that the XTable specifies a plurality of data items or compound data items. This allows a software module, such as the recipient software module, which may have an interface with limited data type support, in effect to receive a variety of different parameters in an efficient and flexible manner.

In step 125, the recipient software module can receive the XTable. If deserialization is needed, i.e. the XTable was serialized, it can be deserialized. Recursion can be used in the deserialization process. In step 130, any data that is needed by the receiving module can be extracted from the XTable and used as may be required.

Figure 2:
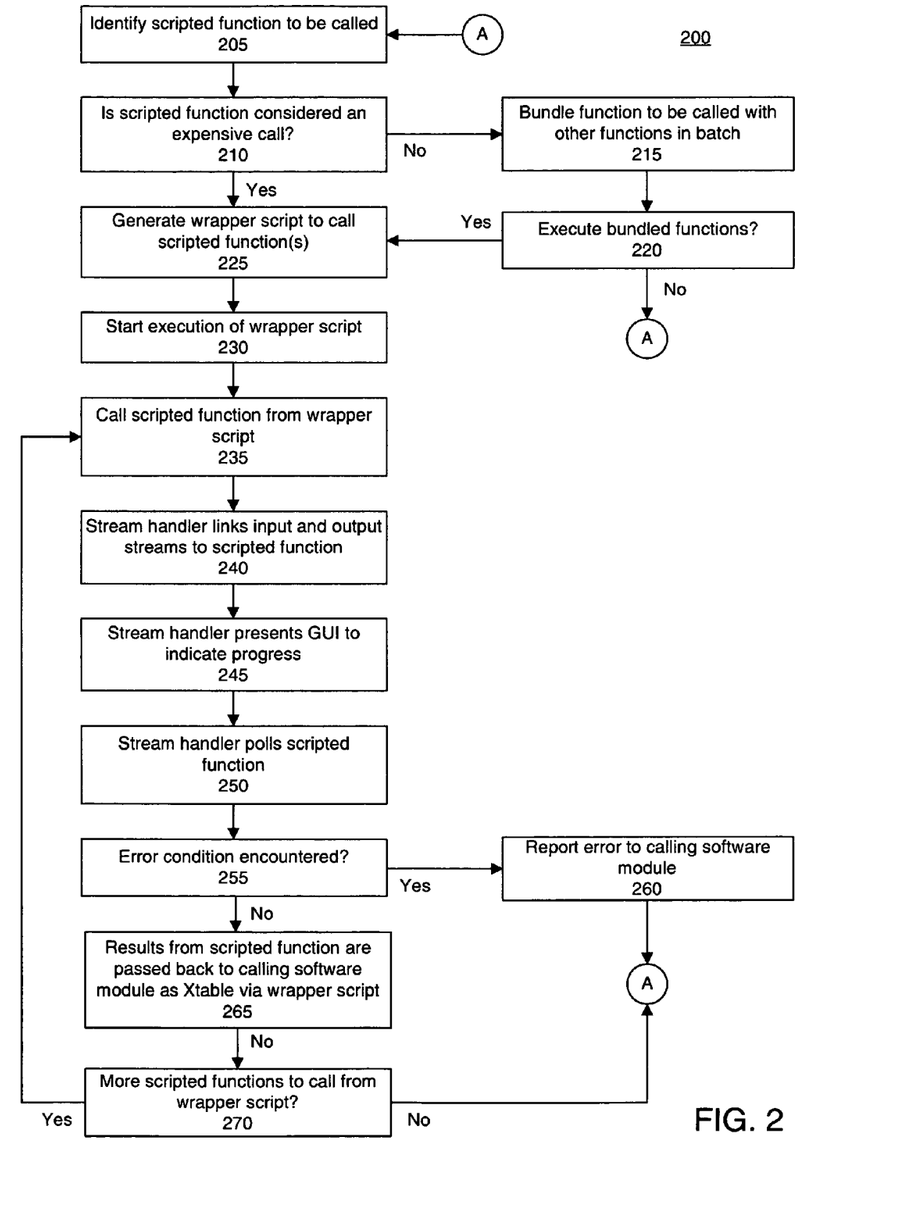
FIG. 2 is a flow chart illustrating a method of implementing a process within an HSS using a scripting language in accordance with another embodiment of the present invention.

FIG. 2 is a flow chart illustrating a method 200 of implementing a process within an HSS using a scripting language in accordance with another embodiment of the present invention. In accordance with some embodiments of the present invention, various processes within an HSS can be performed through the use of one or more scripts. In the case where the HSS is implemented as an HLMS, processes such as generating intermediate files needed for netlisting, processing intermediate files into hardware descriptions, and the like can be performed using one or more scripts. Method 200 describes a technique for dealing with the overhead associated with invoking scripts from within an HSS.

Method 200 can begin in step 205 where a scripted function or subroutine that is to be called from within the HSS can be identified. As noted, the function can be configured to perform various actions or processes within the HSS, such as netlisting for example, though the present invention is not limited to use with this particular function or process. In step 210, the type of scripted function that is to be called can be identified. Functions can be classified as expensive or cheap calls according to various attributes. Each type of call, in reference to the function being called, can be handled differently. The attributes used to classify a function as cheap or expensive can include, but are not limited to, the time frame in which the function is to be called and the type of output that is generated by the function in terms of what is returned to the calling process or software module.

As known, calling scripted functions from within a computing environment can be expensive in terms of computing power. Each individual call to a scripted function invokes an interpreter. Thus, in the case where a series of individual calls are made to PERL functions, each call invokes the PERL interpreter. This can be computationally expensive. In consequence, it can be beneficial to bundle two or more calls to scripted functions so as to invoke the interpreter fewer times, i.e., one time for the entire bundle of calls rather than for each individual call. Bundling function calls allows multiple functions to be called while incurring the overhead of invoking a single scripted function.

In any case, expensive calls refer to scripted functions that must be called immediately within the HSS. A function that is classified as an expensive call further generates an output comprising data, other than a file list, that is provided back to the calling procedure or module. This output may be needed for continued execution of the HSS. By comparison, a cheap call refers to a scripted function that is not required to be executed immediately within the HSS. Functions classified as cheap calls can be executed at some later point in time. Further, while such functions may generate various forms of output, such as intermediate files, the return value from such a function can be a sequence XTable whose values are the names of the files the function has created.

If the function is considered a cheap call, the method can proceed to step 215. In step 215, the function can be bundled with any other functions which also have been classified as cheap calls within the HSS. These functions can be executed in batch by the HSS at some other time. In step 220, a determination can be made as to whether the bundled functions should be executed or further functions should be bundled. In one embodiment, bundled functions can be executed in batch periodically. In another embodiment, bundled functions can be executed when some other condition is met, such as when a minimum number of functions is bundled together to be executed by a single wrapper script. If the bundled functions are to be executed, the method can proceed to step 225. If not, the method can loop back to step 205 and continue processing.

In step 225, a wrapper script can be generated. In general, the HSS can generate a single wrapper script, i.e., a PERL script, which specifies the scripted function(s) to be called along with any input, in the form of XTables, to be provided to each function. When the wrapper script is executed, the function(s) are called in the order specified by the wrapper script. Thus, in the case where the method has proceeded from step 210, a single call to the scripted function can be embedded within the wrapper script along with an XTable to be provided as input to the scripted function being called by the wrapper script. With respect to cheap calls, where the method has proceeded from step 220, a plurality of calls to scripted functions is embedded in the wrapper script. The XTables that are provided as inputs to the called functions also are embedded in the wrapper script.

In step 230, the wrapper script can be executed. If more than one call to a scripted function is embedded within the wrapper script, the calls are executed in the order specified within the wrapper script. As each scripted function is called and executes, it derives its input from the XTable corresponding to that function from the wrapper script. As noted, XTables provide a mechanism through which data can be exchanged between scripts and modules of the HSS. As XTables are formed of known data types, use of an XTable ensures that the calling software module, the wrapper script, as well as the called function can interpret any data contained therein.

Since the wrapper script is written in an interpreted programming language, the wrapper script calls only functions which also are written in the interpreted programming language, i.e., scripted functions. It should be appreciated, however, that the scripted functions called by the wrapper script can call functions written in other programming languages. In illustration, if the wrapper script is written in PERL, the wrapper script calls other PERL functions. The PERL functions that are called by the wrapper script, however, can call functions written in different programming languages such as C++, Java®, or the like.

In step 235, a first scripted function, or next as the case may be, can be called. In step 240, a stream handler module of the HSS can create the links necessary between the called scripted function and the wrapper script for passing input and output (I/O). More particularly, the stream handler can link an output of the wrapper script to an input of the called scripted function, and an input of the wrapper script to an output of the called scripted function. Error handling implemented by the called scripted function also can be linked to the wrapper script. In one embodiment, where the Java® programming language is used, a Java® process launching mechanism can be used. This allows the wrapper script to attach its own I/O streams to corresponding I/O streams of a child process. In another embodiment, where PERL and/or Python is used, "open3" methods can be used for linking I/O.

In step 245, the stream handler can present a graphical user interface (GUI) through which function progress can be illustrated. The progress of a scripted function called by the wrapper script, in terms of performing its particular task, can be illustrated using any of a variety of visual indicators, whether a graph, text, a combination of both, etc. The GUI further can provide an activatable icon, the selection of which by a user can cause the scripted function that is currently executing to terminate, thereby providing control back to the wrapper script.

It should be appreciated that the stream handler can present a GUI in all cases where a wrapper script is called or in select cases. In one embodiment, for example, the GUI can be presented when it is expected that a scripted function will take more than a minimum amount of time to execute. Such can be the case whether the function is classified as an expensive or a cheap call. In another embodiment, the GUI can be presented when a minimum number of scripted functions are to be executed in batch or when the execution of such functions in batch is likely to take more than a minimum amount of time. When the GUI is presented to provide an indication of the progress of a plurality of functions, the GUI further can indicate which function is executing, the progress of that function, as well as an indication of the overall execution progress of the bundle of functions as a whole.

In step 250, the stream handler can poll the wrapper script to ascertain the status of execution of the scripted function. The stream handler can poll the wrapper script from time to time or periodically. If desired, the stream handler can poll the wrapper script using a different thread. The status information ascertained by the stream handler can be used to update the GUI as may be required.

In step 255, the stream handler can determine whether an error condition has been generated by the scripted function. In one embodiment, the scripted function and/or the wrapper script can be configured to generate an error condition by executing a die statement, for example, as known in the PERL programming language. If an error condition has been generated, the method can proceed to step 260 where the error condition can be reported to the wrapper script.

Any error information, for example as may be provided by execution of the die statement, whether in the wrapper script or a called scripted function, can be encoded or formatted as an XTable and returned to a calling module, in this case the module that caused the wrapper script to be generated and/or executed. This allows exception data to be passed from one programming language environment to another. Thus, exception data from an interpreted language such as PERL, can be passed to another software module coded in a language such as C++ or the like.

If no error condition is encountered, the method can proceed to step 265. In step 265, results from the scripted function execution can be passed back to the wrapper script and on to the calling software module in the form of a single XTable. Though not discussed with reference to FIG. 2, it should be appreciated that the passing of an XTable can include serialization and deserialization as was described with reference to FIG. 1. In step 270, if further calls to scripted functions remain to be executed within the wrapper script, the method can loop back to step 235 to continue processing. If not, the method can loop back to step 205 to continue processing.

Table 3 illustrates an embodiment of the present invention in which an HSS makes a call to a subroutine named mySub defined by a module named MyMod.

TABLE 3

MyMod Module

```
package MyMod;
require Exporter;
@ISA = qw(Exporter);
@EXPORT = qw(mySub);
use strict;
use warnings;
sub mySub {
    my $seq = $_[0];
    push(@$seq, 4);
    return $seq;
}
```

The subroutine mySub is passed a sequence XTable as a parameter. The subroutine mySub augments the sequence with a new element and then returns the resulting XTable.

Table 4 illustrates a wrapper script that can be built by an HSS to call the subroutine in accordance with one embodiment of the present invention.

TABLE 4

Wrapper Script

```
use strict;
use SgXtable;
use MyMod;
use vars qw($results);
eval {
    my $seq = [1, 2, 3];
    open(RESULTS, ">c:/temp/script_results") ||
        die "couldn't open c:/temp/script_results";
    binmode(RESULTS);
    $results = &SgXtable::toString(&MyMod::mySub($seq));
};
if ($@) {
    print RESULTS "$@\n";
    close(RESULTS) || die "trouble writing exception text";
    exit(1);
};
print RESULTS $results . "\n";
close(RESULTS) ||
    die "trouble writing c:/temp/script_results";
exit(0);
```

The line my $arg=[1, 2, 3]; in the wrapper script illustrated in Table 4 defines the sequence XTable to be passed as an argument to the subroutine. The line $results=&SgXtable::toString(&MyMod::mySub($arg)); calls the subroutine, passing the sequence as an argument. The subroutine adds the element to the sequence and returns the result. A textual representation of the result is written to the file c:/temp/script_results by the following lines:

print RESULTS $results. "\n";
close(RESULTS) ||
  die "trouble writing c:/temp/script_results";

To call the script from Java® or C++, an HSS can launch the wrapper script and then wait until the script completes. If the script exit value is zero, then the subroutine succeeded. In this case, the HSS obtains the return value of the subroutine from the file c:/temp/script_results. Otherwise, the script failed and the HSS obtains an error message from the file.

Figure 3:
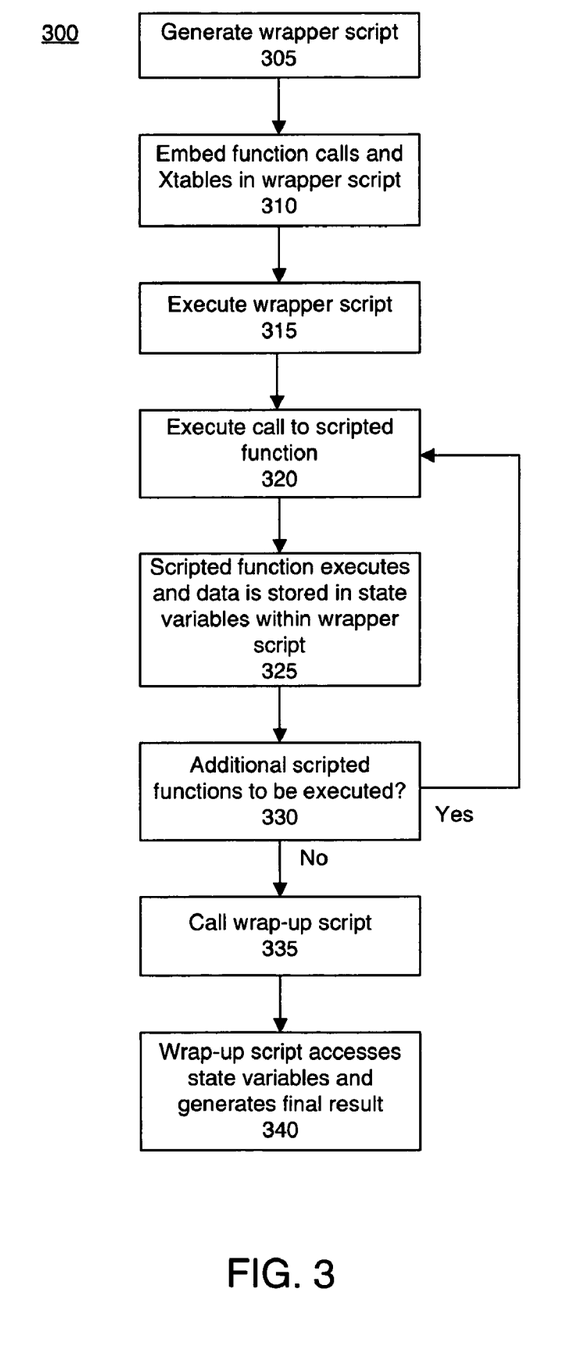
FIG. 3 is a flow chart illustrating a method of calling a plurality of collaborative functions in accordance with yet another embodiment of the present invention.

FIG. 3 is a flow chart illustrating a method 300 of calling a plurality of collaborative, scripted functions in accordance with another embodiment of the present invention. In some cases, one or more functions within an HSS must interact, or collaborate, with one another to produce a final result. The interactions of these scripted functions can be coordinated through the use of a wrapper script and state variables maintained within the wrapper script module.

Method 300 can begin in step 305 where a wrapper script is generated. The wrapper script includes state variables which are available to the various scripted functions that will be called from the wrapper script. In step 310, calls to the scripted functions and the data to be provided to each scripted function can be embedded within the wrapper script. As noted, the data to be provided as input can be formatted as XTables. That is, an XTable can be embedded for each scripted function to be called from the wrapper script.

In step 315, the wrapper script can be executed. When the wrapper script is executed, the function calls can be executed in the order in which the calls are listed or specified within the wrapper script. In step 320, a first, or next, call to a scripted function can be executed. In step 325, the scripted function can be executed. As noted, the called function obtains input from the corresponding XTable that has been embedded in the wrapper script. In illustration, in the context of an HLMS for an integrated circuit, the function can be configured to create a multiplier for a circuit having a plurality of multipliers. Results from execution of the scripted function can be stored within one or more state variables maintained within the wrapper script.

In step 330, a determination can be made as to whether additional scripted functions remain to be called. Continuing with the previous example of a circuit design having a plurality of multipliers, a scripted function can be called for each multiplier to be included within the circuit design. Each scripted function can create the data necessary for generating a single multiplier entity in accordance with specified circuit constraints. The data relating to each individual multiplier entity can be stored in state variables maintained within the wrapper script.

If additional scripted functions remain to be called, the method can loop back to step 320 and continue until no further functions from the wrapper script remain to be executed. If no further scripted functions remain to be executed, however, the method can proceed to step 335 where a wrap-up script can be called. The wrap-up script can determine which scripted functions have executed and collect the results from each execution from the state variables. In one embodiment, the wrap-up script can be called from the wrapper script so that the wrap-up script maintains access to the state variables contained therein. In step 340, the wrap-up script accesses state variables and generates a final result. More particularly, the wrap-up script processes the data stored in the state variables to create the final result. For example, the wrap-up function can create one compound multiplier entity using the stored state information from the functions which implemented the individual multiplier entities.

The embodiments of the present invention can be realized in hardware or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program, software, application, or any variant thereof, in the present context, means any expression, in any language, code or notation, of a set of instructions intended to cause a system having an information processing capability to perform a particular function either directly or after either or both of the following: a) conversion to another language, code, or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of passing data among modules of a heterogeneous software system executing within at least one computer, the method comprising:

classifying each call to a scripted function in the heterogeneous software system as either computationally expensive or computationally cheap;

for each scripted function classified as computationally expensive, building a respective wrapper script with a call to the computationally expensive scripted function and no other calls to scripted functions;

selecting two or more scripted functions to be executed within the heterogeneous software system in response to the two or more scripted functions being classified as computationally cheap;

building a wrapper script by embedding, within the wrapper script, respective calls to the two or more scripted functions and XTable objects associated with the two or more scripted functions, respectively, and storing the wrapper script;

executing the wrapper script thereby causing the two or more scripted functions to execute and use the respective XTable objects as input;

wherein the two or more scripted functions are executed with one invocation of an interpreter of the two or more the scripted functions by the wrapper script; and storing results from execution of the two or more scripted functions, wherein the classifying, selecting, building, executing, and storing are performed and are executable by the at least one computer.

2. The method of claim 1, said storing step further comprising generating two or more respective XTable objects comprising the results from execution of the two or more scripted functions, wherein at least one of the two or more XTable objects comprises a first data element of a first data type and at least a second data element of at least a second data type.

3. The method of claim 2, wherein the heterogeneous software system software system comprises at least two software modules implemented in different programming languages, wherein generating the XTable objects comprises including only data items of data types that are common to all of the different programming languages used to implement the heterogeneous software system excluding pointers.

4. The method of claim 1, further comprising:
wherein a call to a scripted function is classified as computationally cheap in response to determining the scripted function generates a file list as output.

5. The method of claim 1,
wherein a call to a scripted function is classified as computationally expensive in response to determining the scripted function generates data that does not comprise a file list as output.

6. The method of claim 1, further comprising visually indicating a status of execution of each scripted function.

7. The method of claim 1, further comprising presenting a control, wherein selection of the control causes execution of a scripted function to terminate.

8. A computer program product, comprising:
a computer-readable storage device storing computer-executable code for passing data among modules of a heterogeneous software system executing within at least one computer, the computer-executable code comprising instructions that when executed by the at least one computer cause the at least one computer to perform operations including:
distinguishing each call to a scripted function in the heterogeneous software system as being either computationally expensive or computationally cheap;
for each computationally expensive scripted function, building a respective wrapper script with a call to the computationally expensive scripted function and no other calls to scripted functions;
selecting a plurality of scripted functions to be executed in batch within the heterogeneous software system according to a type of output generated by each scripted function;
wherein the plurality of scripted functions have been determined to be computationally cheap;
building a wrapper script by embedding a call to each of the plurality of scripted functions and an input object associated with each of the plurality of scripted functions within the wrapper script and storing the wrapper script;
executing the wrapper script, wherein the plurality of scripted functions store intermediate results within state variables defined within the wrapper script;
wherein the plurality of scripted functions are executed with one invocation of an interpreter of the plurality of scripted functions by the wrapper script; and
generating a final result according to the intermediate results stored in the state variables and storing the final result.

9. The computer program product of claim 8, said generating step further comprising executing a wrap-up script which produces a result which depends upon the intermediate results from the state variables.

10. The computer program product of claim 8, wherein the input objects embedded within the wrapper script are configured as XTables.

11. The computer program product of claim 8, wherein the operations further comprise indicating a measure of progress for execution of at least one of the plurality of scripted functions.

12. The computer program product of claim 8, wherein the operations further comprise indicating a measure of progress for execution of the plurality of scripted functions as a whole.

13. The computer program product of claim 8, wherein the operations further comprise indicating which scripted function of the plurality of scripted functions is executing at a given time.

14. The computer program product of claim 8, wherein the operations further comprise presenting a control, wherein selection of the control causes execution of at least one scripted function to discontinue.

15. A computer system, comprising a storage device storing computer-executable code for passing data among a plurality of software modules executing within the computer system, the computer-executable code comprising instructions that when executed by the computer system cause the computer system to perform operations including:
distinguishing between expensive scripted functions and cheap scripted functions, wherein expensive scripted functions generate data as output that does not comprise a file list, and wherein cheap scripted functions generate a file list as output;
for each expensive scripted function, building and storing a respective wrapper script, wherein building the wrapper script comprises embedding a single call to an expensive scripted function and an input object associated with the expensive scripted function within the wrapper script;
for a plurality of cheap scripted functions, building and storing one wrapper script, wherein building the one wrapper script comprises embedding a call to each of the plurality of cheap scripted functions and an input object associated with each of the plurality of cheap scripted functions within the one wrapper script; and
executing each respective wrapper script and the one wrapper script thereby causing each scripted function specified therein to execute,
wherein the plurality of cheap scripted functions are executed with one invocation of an interpreter of the plurality of cheap scripted functions by the one wrapper script.

16. The computer system of claim 15, wherein the operations further comprise obtaining a result object from execution of each scripted function.

17. The computer system of claim 16, wherein the result object for each scripted function is an XTable.

18. The computer system of claim 15, wherein each input object embedded within the wrapper script is an XTable.

19. The computer system of claim 15, wherein the operations further comprise presenting an indication of execution progress for at least one scripted function called by each wrapper script.

20. The computer system of claim 15, wherein the operations further comprise:
detecting a fault condition during execution of a scripted function called by each wrapper script; and
formatting fault data from the fault condition as an XTable to be provided to a software module of the heterogeneous software system.

* * * * *